(12) United States Patent
Berger et al.

(10) Patent No.: US 7,108,953 B2
(45) Date of Patent: Sep. 19, 2006

(54) DISSOLUTION INHIBITORS IN PHOTORESIST COMPOSITIONS FOR MICROLITHOGRAPHY

(75) Inventors: Larry L. Berger, Chadds Ford, PA (US); Jerald Feldman, Hockessin, DE (US); Viacheslav Alexandrovich Petrov, Hockessin, DE (US); Frank L. Schadt, III, Wilmington, DE (US); Andrew E. Feiring, Wilmington, DE (US); Fredrick Claus Zumsteg, Jr., Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 179 days.

(21) Appl. No.: 10/380,990

(22) PCT Filed: Oct. 12, 2001

(86) PCT No.: PCT/US01/42662

§ 371 (c)(1),
(2), (4) Date: Mar. 19, 2003

(87) PCT Pub. No.: WO02/31595

PCT Pub. Date: Apr. 18, 2002

(65) Prior Publication Data

US 2005/0260519 A1 Nov. 24, 2005

(51) Int. Cl.
| G03C 1/73 | (2006.01) |
| G03C 1/76 | (2006.01) |
| G03F 7/039 | (2006.01) |
| G03F 7/20 | (2006.01) |
| G03F 7/30 | (2006.01) |

(52) U.S. Cl. ............... 430/270.1; 430/326; 430/905; 430/907; 430/311; 430/271.1; 430/272.1

(58) Field of Classification Search .......... 430/270.1, 430/905, 325, 326
See application file for complete search history.

(56) References Cited

U.S. PATENT DOCUMENTS

| 2004/0023157 A1* | 2/2004 | Feiring et al. ........... 430/272.1 |
| 2005/0191579 A1* | 9/2005 | Feiring et al. ........... 430/270.1 |

FOREIGN PATENT DOCUMENTS

| DE | 42 07 261 A1 | 9/1993 |
| EP | 1 035 441 A1 | 9/2000 |
| WO | WO 00/17712 A | 3/2000 |
| WO | WO 00/25178 A | 5/2000 |

OTHER PUBLICATIONS

L. F. Thompson, C. G. Willson, and M. J. Bowden, "Organic Resist Materials", Introduction to Microlithography, 1994, pp. 139-267, Second Edition, American Chemical Society, Washington, DC.

E. Reichmanis et al., "The Effect of Substituents on the Photosensitivity of 2-Nitrobenzyl Ester Deep U.V. Resists," J. Electrochem. Soc., 1983, pp. 1433-1437, vol. 130.

K. Patterson, et al., "Polymers for 157 nm Photoresist Applications: A Progress Report," Proceedings of the SPIE, The International Society for Optical Engineering, 2000, pp. 365-374, vol. 39999, No. 1, XP-002200721.

K. J. Przybilla, et al., "Hexafluoroacetone in Resist Chemistry: A Versatile New Concept for Materials for Deep UV Lithography," Proceedings of the SPIE, The International Society for Optical Engineering, 1992, pp. 500-512, vol. 1672, No. 1, XP 000912223.

\* cited by examiner

*Primary Examiner*—Sin Lee

(57) ABSTRACT

The invention relates to a photoresist composition comprising a polymeric binder; a photoactive component; and at least one dissolution inhibitor comprising a paraffinic or cycloparaffinic compound containing at least one functional group having the structure —$C(R_f)(R_f')OR$ wherein $R_f$ and $R_f'$ are the same or different fluoroalkyl groups of from one or taken together are $(CF_2)_a$ wherein a is an integer ranging from 2 to about 10 and R is a hydrogen atom or an acid labile protecting group. Typically, the dissolution inhibitor has an absorption coefficient of less than about 4.0 μm at a wavelength of 157 nm.

38 Claims, No Drawings

DISSOLUTION INHIBITORS IN PHOTORESIST COMPOSITIONS FOR MICROLITHOGRAPHY

FIELD OF THE INVENTION

The present invention pertains to a photoresist composition, in particular, for the production of semiconductor devices. The present invention also pertains to fluorine-containing compounds having high UV transparency (particularly at short wavelengths, e.g., 157 nm) which are useful as dissolution inhibitors in resists.

BACKGROUND OF THE INVENTION

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication.

For imaging very fine features at the submicron level in semiconductor devices, electromagnetic radiation in the far or extreme ultraviolet (UV) is needed. Positive working resists generally are utilized for semiconductor manufacture. Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of 0.35–0.18 nm. There is strong impetus for future photolithography at even shorter wavelengths, due to a decreasing lower resolution limit with decreasing wavelength (i.e., a resolution limit of 0.18–0.12 micron for 193 nm imaging and a resolution limit of about 0.07 micron for 157 nm imaging). Photolithography using 193 nm exposure wavelength (obtained from an argon fluorine (ArF) excimer laser) is a leading candidate for future microelectronics fabrication using 0.18 and 0.13 μm design rules.

Photolithography using 157 nm exposure wavelength (currently obtained from a fluorine excimer laser) is a leading candidate for future microlithography (beyond 193 nm) provided suitable materials can be found having sufficient transparency and other required properties at this very short wavelength.

A dissolution inhibitor (DI) may be utilized in a photoresist composition. Typically, a dissolution inhibitor is included in a photoresist composition to assist in the development process. A good dissolution inhibitor will inhibit the unexposed areas of the photoresist layer from dissolving during the development step in a positive working system. A useful dissolution inhibitor may also function as a plasticizer which function provides a less brittle photoresist layer that will resist cracking. These features are intended to improve contrast, plasma etch resistance, and adhesion behavior of photoresist compositions.

A variety of bile-salt esters (i.e., cholate esters) are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", *J. Electrochem. Soc.* 1983,130,1433–1437.) Bile-salt esters are useful as DIs for several reasons, including their availability from natural sources, high alicyclic carbon content, and particularly their transparency in the deep and vacuum UV region, (which essentially is also the far and extreme UV region), of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Some examples of bile-salt esters include cholic acid, deoxycholic acid, lithocholic acid, t-butyl deoxycholate, t-butyl lithocholate, and t-butyl-3-α-acetyl lithocholate. However, the ester groups that are present in these compounds tend to strongly absorb light at very short wavelengths which makes the bile-salt esters less desirable as dissolution inhibitors at wavelengths of less than 193 nm. Carefully controlling the quantity of the bile-salt ester and/or the photoresist layer thickness are possible approaches for overcoming the absorption characteristics of bile-salt esters when imaging at the shorter wavelengths. These approaches have disadvantages since a process parameter such as quantity control has associated costs and a thinner photoresist layer, as compared to a thicker layer, will often have a higher number of defects that arise during imaging.

A need still exists for dissolution inhibitors that are not only transparent at short wavelengths but compatible with the polymeric binders that are useful at the shorter wavelengths.

In the process of forming patterned microelectronic structures by means of lithography, it is common in the art to use at least one antireflective layer either beneath the photoresist layer, a BARC, or on top of the photoresist layer, a TARC, (or sometimes referred to simply as an ARC) or both. Antireflective coating layers have been shown to reduce the deleterious effects of film thickness variations, and the resulting standing waves caused by the interference of light reflecting from various interfaces within the photoresist structure, and the variations in the exposure dose in the photoresist layer due to loss of the reflected light. The use of an antireflective layer results in improved patterning and resolution characteristics of the photoresist materials because it suppresses reflection related effects.

A need also exist for antireflective coatings that have optical transparency at imaging wavelengths of 193 nm and or 157 nm.

SUMMARY OF THE INVENTION

In a first aspect the invention provides a photoresist composition comprising:
(a) a polymeric binder;
(b) a photoactive component; and
(c) at least one dissolution inhibitor comprising a paraffinic or cycloparaffinic compound containing at least one functional group having the structure —C($R_f$)($R_f'$)OR wherein $R_f$ and $R_f'$ are the same or different fluoroalkyl groups of from one to about ten carbon atoms or taken together are $(CF_2)_a$ wherein a is an integer ranging from 2 to about 10 and R is a hydrogen atom or an acid labile protecting group.

In another aspect, the invention relates to a process for forming a relief image on a substrate having a photoresist layer comprising, in order:

(A) imagewise exposing the photoresist layer to form imaged and non-imaged areas, wherein the photoresist layer is prepared from a photoresist composition comprising:
 (a) a polymeric binder;
 (b) at least one photoactive component; and
 (c) at least one dissolution inhibitor comprising a paraffinic or cycloparaffinic compound containing at least one functional group having the structure

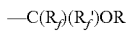
—C($R_f$)($R_f'$)OR wherein $R_f$ and $R_f'$ are the same or different fluoroalkyl groups of from one to about ten carbon atoms or taken together are $(CF_2)_a$ wherein a is an integer ranging from 2 to about 10 and R is a hydrogen atom or an acid labile protecting group; and (B) developing the imagewise exposed photoresist layer to form the relief image on the substrate.

In one embodiment, the dissolution inhibitor has an absorption coefficient of less than about 4.0 $\mu m^{-1}$ at a wavelength of 157 nm, typically, less than about 3.5 $\mu m^{-1}$ at a wavelength of 157 nm and even more typically, less than about 3.0 $\mu m^{-1}$ at a wavelength of 157 nm.

DETAILED DESCRIPTION

The photoresist compositions of the invention comprise a polymeric binder; a photoactive component; and at least one dissolution inhibitor comprising a paraffinic or cycloparaffinic compound containing at least one functional group having the structure

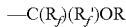
—C($R_f$)($R_f'$)OR wherein $R_f$ and $R_f'$ are the same or different fluoroalkyl groups of from one to about ten carbon atoms or taken together are $(CF_2)_a$ wherein a is an integer ranging from 2 to about 10 and R is a hydrogen atom or an acid labile protecting group. The dissolution inhibitor has been found to possess an absorption coefficient of less than about 4.0 $\mu m^{-1}$ at a wavelength of 157 nm. More typically, the dissolution inhibitor has an absorption coefficient of less than about 3.5 $\mu m^{-1}$ at a wavelength of 157 nm, and still more typically the dissolution inhibitor has an absorption coefficient of less than about 3.0 $\mu m^{-1}$ at a wavelength of 157 nm.

Polymeric Binders:

The binders useful for this invention comprise any polymer that has the transparency properties suitable for use in microlithography. It is contemplated that binders suitable for the present invention may include those polymers that are typically incorporated into chemically amplified 248 (deep UV) and 193 nm photoresists for imaging at longer wavelengths. A typical 248 nm resist binder is based on polymers of para-hydroxystyrene. Other examples of suitable 248 nm resist binders can be found in the reference *Introduction to Microlithography*, Second Edition by L. F. Thompson, C. G. Willson, and M. J. Bowden, American Chemical Society, Washington, D.C., 1994, Chapter 3. Binders useful for 193 nm photoresists include cycloolefin-maleic anhydride alternating copolymers [such as those disclosed in F. M. Houlihan et al., *Macromolecules*, 30, pages 6517–6534 (1997); T. Wallow et al., *Proc. SPIE*, 2724, 355; and F. M. Houlihan et al., *Journal of Photopolymer Science and Technology*, 10, 511(1997)], polymers of functionalized norbornene-type monomers prepared by metal-catalyzed vinyl addition polymerization or ring-opening metathesis polymerization [such as those disclosed in U. Okoroanyanwu et al. *J. Mol. Cat. A: Chemical* 133, 93 (1998), and PCT WO 97/33198], and acrylate copolymers [those described in U.S. Pat. No. 5,372, 912]. Photoresist binders that are suitable for use with this invention also include those which are transparent at wavelengths below 248 and 193 nm such as those polymers containing fluoroalcohol functional groups [such as those disclosed in K. J. Pryzbilla et al. *Proc. SPIE* 1672, 9 (1992), and H. Ito et al. *Polymn. Mater. Sci. Eng.* 77, 449 (1997)].

Typical examples of polymers which are also useful are those which have been developed for use in chemically amplified photoresists which are imaged at an irradiation wavelength of 157 nm. Specific examples of such polymers are fluoropolymers and fluoropolymers containing fluoroalcohol functional groups. Suitable examples have been disclosed in WO 00/17712 and WO 00/25178.

The quantity of polymeric binder in the photoresist composition may be in the amount of about 50 to about 99.5 weight % based on the total weight of the photoresist composition (solids).

Photoactive Component (PAC)

The photoresist composition contains a combination of binder and photoactive component.

If the polymer of the binder itself is photoactive, a separate photoactive component is not required. It is contemplated that the photoactive component may be chemically bonded to the polymer of the binder. A system in which the polymeric binder itself is photochemically active is described in EP 473547. Therein a photoresist comprises an olefinically unsaturated sulfonium or iodonium salt (the photochemically active component) copolymerized with an olefinically unsaturated comonomer containing an acid sensitive group yielding a radiation-sensitive copolymer that would be an effective photoactive polymeric binder.

When the compositions of this invention contain a separate photoactive component (PAC) the binder itself is usually not photactive.

The photoactive component (PAC) usually is a compound that produces either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

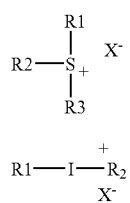

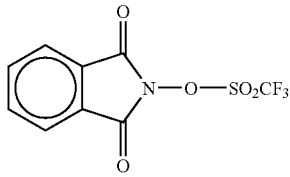

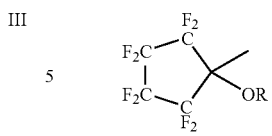

In structures I–II, $R_1$–$R_3$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X— in structures I–II can be, but is not limited to, $SbF_6$– (hexafluoroantimonate), $CF_3SO_3$– (trifluoromethylsulfonate=triflate), and $C_4F_9SO_3$– (perfluorobutylsulfonate).

Dissolution Inhibitor

The dissolution inhibitors of this invention may satisfy multiple functional needs including dissolution inhibition, plasma etch resistance, plasticising and adhesion behavior of resist compositions.

The dissolution inhibitor of this invention comprises compounds which have been found to have a sufficiently low absorption coefficient for use in microlithography at short wavelengths. Specifically, the compounds of this invention have been found to possess an absorption coefficient of less than about 4.0 $\mu m^{-1}$ at a wavelength of 157 nm, typically, less than about 3.5 $\mu m^{-1}$ at a wavelength of 157 nm, and still more typically less than about 3.0 $\mu m^{-1}$ at a wavelength of 157 nm and still more typically less than about 2.5 $\mu m^{-1}$ at a wavelength of 157 nm.

Dissolution inhibitors of this invention comprise a paraffinic or cycloparaffinic compound containing at least one functional group, typically at least two, more typically 2 to about 10 and most typically 2 to 3 functional groups having the structure —C($R_f$)($R_f'$)OR wherein $R_f$ and $R_f'$ are the same or different fluoroalkyl groups of from one to about ten carbon atoms or $R_f$ and $R_f'$ taken together are $(CF_2)_a$ wherein a is an integer ranging from 2 to about 10 and R is a hydrogen atom or an acid labile protecting group. Typically, when the compound contains at least 2 of the functional groups there is improved solubility of the dissolution inhibitor in the developed form and less solubility in the undeveloped form.

Typically, $R_f$ and $R_f'$ are independently a perfluoroalkyl group of 1 to about 5 carbon atoms, more typically a perfluoroalkyl group of 1 to about 3 carbon atoms, and most typically Rf and Rf are both trifluoromethyl ($CF_3$).

The fluoroalkyl groups, designated as Rf and Rf, can be partially fluorinated alkyl groups or fully fluorinated alkyl groups (i.e., perfluoroalkyl groups).

When $R_f$ and $R_f'$ are "taken together" it is meant that $R_f$ and $R_f'$ form a ring structure of 3 to about 11 carbon atoms such as is illustrated below in case of a 5-membered ring:

When $R_f$ and $R_f'$ are partially fluorinated alkyl groups there must still be a sufficient degree of fluorination present so that when R is a hydrogen atom the hydroxyl group possesses sufficient acidity that the hydroxyl proton is substantially removed in basic media, such as in aqueous sodium hydroxide solution or tetraalkylammonium hydroxide solution.

In preferred cases according to the invention, there will be sufficient fluorine substitution present in the fluorinated alkyl groups of the fluoroalcohol functional group such that the hydroxyl group will have a pKa value as follows: 5<pKa<11.

The substituent R of the compound of this invention is a hydrogen atom or an acid labile protecting group. When R is an acid labile protecting group it may be selected such that when a photoacid is produced upon imagewise exposure, the acid will catalyze deprotection and production of hydrophilic acid groups that are necessary for development under aqueous conditions. Acid labile R groups include, but are not limited to A) a carbonate formed from a tertiary aliphatic alcohol, B) a tertiary aliphatic or other group which forms a stabilized carbocation, and C) an acetal group. A can be a carbonate formed from a tertiary aliphatic alcohol containing about 4 to about 25 carbon atoms and B can contain from about 4 to 25 carbon atoms which may be an aliphatic, alicyclic or combination of aliphatic and alicyclid.

Some specific examples in category A) are t-butyl, 2-methyl-2-adamantyl, and isobornyl carbonates.

Some specific examples in category B) are t-butyl, 2-methyl-2-adamantyl, cyclopropylcarbinyl, 2-propenyl, and 2-trimethylsilylethyl.

Some specific examples in category C) are 2-tetrahydropyranyl, 2-tetrahydrofuranyl, and alpha-alkoxyalkyl such as methoxymethyl and ethoxymethyl.

An alpha-alkoxyalkyl ether group is a preferred acid labile protecting group R and maintains a high degree of transparency in the photoresist composition. The resulting protected fluoroalcohol group has the structure —C($R_f$)($R_f'$)OCH$_2$OCHR$^5$ wherein $R^5$ is an alkyl group of 1 to about 10 carbon atoms, optionally $R^5$ contains a heteroatom such as oxygen.

In one aspect of this invention, the dissolution inhibitor is an oligomer comprising a repeat unit derived from at least one, typically at least 2, more typically 2 to about 10, and even more typically 2 to about 3 ethylenically unsaturated compounds containing a protected fluoroalcohol functional group having the following structure —C($R_f$)($R_f'$)OR wherein $R_f$ and $R_f'$ are as described herein.

An oligomer is a low molecular weight polymer (e.g. dimer, trimer, tetramer), in the present case, with a number average molecular weight of less than or equal to 3000. As is well known to those skilled in the art, certain ethylenically unsaturated compounds (monomers) undergo free radical polymerization or metal-catalyzed addition polymerization to form polymers having repeat unit(s) derived from the ethylenically unsaturated compounds. By suitable adjustments in polymerization conditions and especially by employing a chain transfer agent or chain terminating agent in the synthesis, the molecular weight of the product may be controlled to the desired range. The radical copolymerization of ethylenically unsaturated monomers containing a protected fluoroalcohol group may involve including the protected acid groups in one or more comonomer(s) that are polymerized to form a given copolymeric base resin. Alternatively, a copolymeric base resin can be formed by copolymerization with an acid-containing comonomer and then subsequently acid functionality in the resulting acid-containing copolymer can be partially or wholly converted by appropriate means to derivatives having protected acid groups, as disclosed in PCT US 00/11539.

Chain transfer agents which are useful for controlling molecular weight in free radical polymerizations are well known in the art and include primary and seconday alcohols, such as methanol, ethanol and 2-propanol, chlorocarbons, such as carbon tetrachloride, and thiols, such as dodecyl mercaptan. Transition metal-catalyzed addition polymerization of monomers containing protected or unprotected fluoroalcohol functional groups may be employed. Molecular weight can be reduced so as to form oligomers by the addition of suitable chain-transfer agents; for example, hydrogen, silanes, or olefins such as ethylene, propylene, or 1-hexene. The use of olefins to control and reduce molecular weight in polymerizations of norbornene-type monomers catalyzed by nickel and palladium catalysts is known in the art; for example, see U.S. Pat. No. 5,741,869; 5,571,881; 5,569,730 and 5,468,819.

Some illustrative, but nonlimiting, examples of representative monomers containing a protected fluoroalcohol group and within the scope of the invention are presented below:

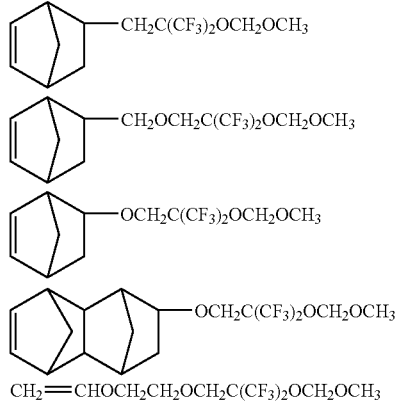

CH$_2$=CHOCH$_2$CH$_2$OCH$_2$C(CF$_3$)$_2$OCH$_2$OCH$_3$

Some illustrative but nonlimiting examples of oligomers containing a protected fluoroalcohol group within the scope of this invention are illustrated below.

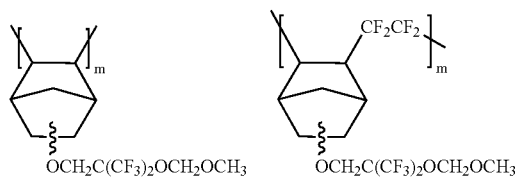

wherein m is an integer from 2 to 9.

In another aspect of this invention, the dissolution inhibitor is a compound having the following structure

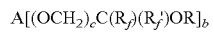

A[(OCH$_2$)$_c$C(R$_f$)(R$_f'$)OR]$_b$ wherein A is a paraffinic or cycloparaffinic group containing 2 to 30 carbon atoms, R$_f$ and R$_f'$ are as described herein above, b is an integer ranging from at least 1, typically at least 2, more typically 2 to about 10 and most typically 2 to 3 and c is an integer of 0 or 1.

The paraffinic or cycloparaffinic group is understood to be one comprising carbon and hydrogen atoms and to be substantially free of ethylenic, acetylenic or aromatic unsaturation. The paraffinic or cycloparaffinic group may contain heteroatoms selected from the group consisting of fluorine, chlorine and oxgen. Such heteroatoms may form substituent groups which do not substantially contribute to absorption at short wavelengths of light. Specific examples of such oxygen containing substituent groups are hydroxyl and ether. It is also contemplated that the oligomer may be cycloparaffinic. For example, a cycloparaffinic starting material is 4,4'-isopropylidenedicyclohexanol. As another example, a contemplated oligomer containing one or more cycloparaffin rings has a steroidal nucleus. By steroidal nucleus it is meant that the oligomer has as a common nucleus a fused, reduced 17-carbon atom ring system.

Some illustrative, but nonlimiting, examples of dissolution inhibitors within the scope of this embodiment are presented below:

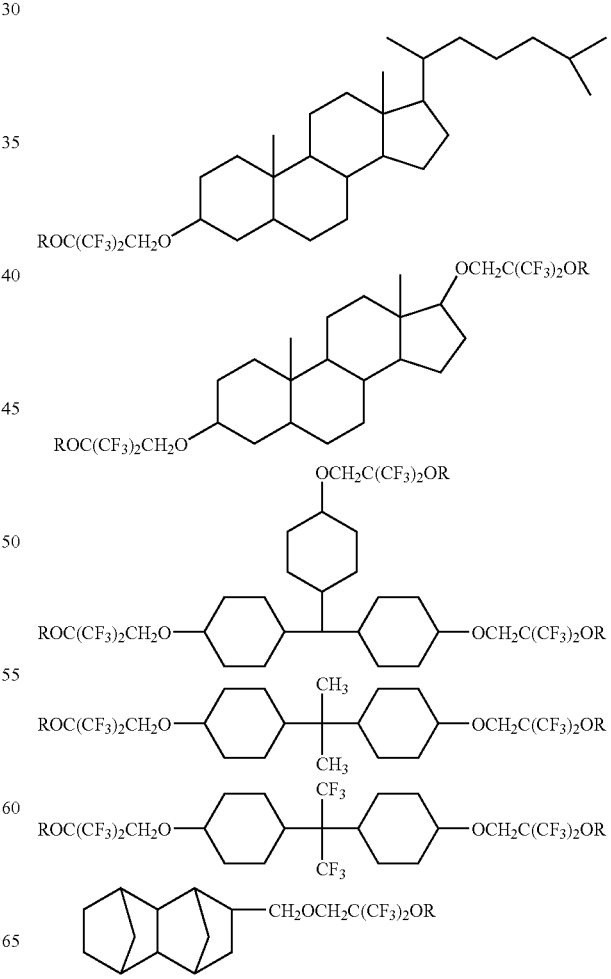

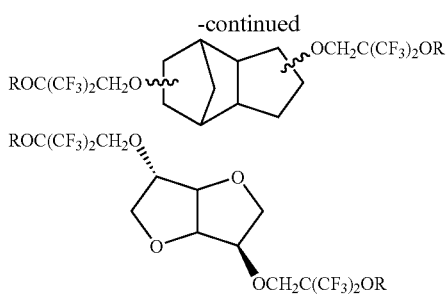

Certain steroidal dissolution inhibitors are reaction products from reduction of a cholate steroidal reactant followed by reaction of the hydroxyl group with hexafluoroisobutylene oxide and subsequent protection reaction, usually to form an acid labile protecting group, such as an alkoxyalkyl ether group typically methoxymethyl ether.

Examples of cholate steroidal reactants are selected from the group consisting of t-butyl lithocholate, t-butyl deoxycholate and t-butyl cholate. In a usual embodiment, the $CO_2$-t-butyl group of the t-butyl lithocholate is replaced by $CH_2O—CH_2C(CF_3)_2—O—CH_2—O—CH_3$.

Some specific dissolution inhibitors are presented below:

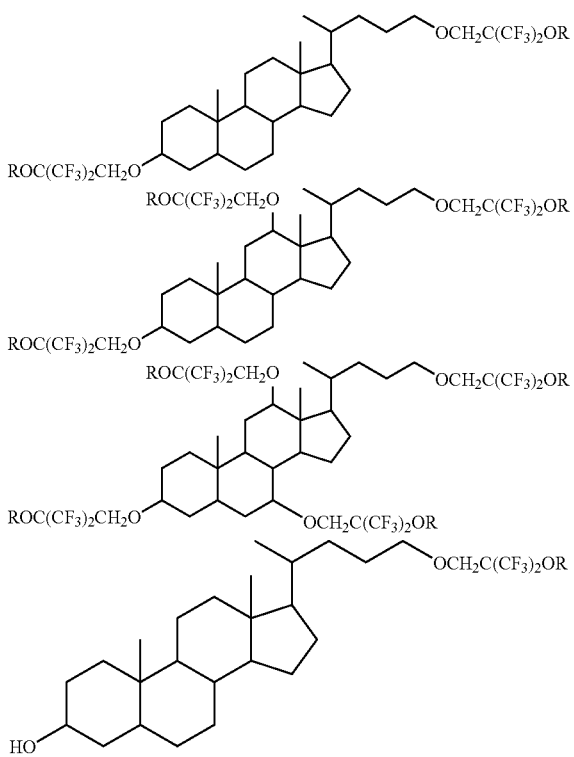

In cases wherein the dissolution inhibitor of this invention contains more than one $—C(R_f)(R_f')OR$ group, the R, $R_f$ and $R_f'$ groups may be the same or different. In particular, one or more of the R groups may be H and one or more may be acid labile protecting groups as described above. One skilled in the art may select a given ratio of protected and unprotected fluoroalcohol groups for a given structure so as to optimize the desired combination of properties.

The fluoroalcohol functional group (protected or unprotected) of this invention can be used alone or it can be used in combination with one or more other acid groups, such as carboxylic acid functional group (unprotected) and t-butyl ester of carboxylic acid functional group (protected).

The dissolution inhibitor may be prepared by processes know in the art, for example, by reaction of Grignard or alkyl lithium reagents with hexafluoroacetone, followed by reaction with chloromethylmethylether. A convenient synthesis of fluorinated alcohols is by reaction of alcohols with 1,1-bis(trifluoromethyl)oxirane under basic conditions. Thus, hydroxyl groups in an alcohol, diol or triol may be converted to the corresponding alkali metal alkoxides by reaction with a suitable base such as sodium hydride in an inert solvent. Suitable solvents include tetrahydrofuran and dimethylformamide. Treatment of a solution or suspension of the alkoxide with 1,1-bis(trifluoromethyl)oxirane results in formation of the corresponding fluorinated alkoxide which can be isolated in the form of the fluorinated alcohol after acidification. Alternatively, the fluorinated alkoxide may be reacted with a suitable capping reagent such as chloromethyl methyl ether to form the protected version of the fluorinated alcohol. Additionally, synthesis may be by reaction of an alcohol such as 4,4'-isopropylidene dicyclohexanol, with a fluorinated oxide such as hexafluoroisobutylene oxide under similar conditions followed by reaction with a halogenated alkyl ether, such as chloromethyl methyl ether as a capping reagent. The reaction product is isolated in any suitable manner. A suitable dissolution inhibitor may also be prepared by reaction of a compound having one or more phenolic groups with 1,1-bis(trifluoromethyl)oxirane in order to attach fluorinated alcohol groups to at least one or all of the phenolic groups. The unsaturated rings are then converted to saturated cyclohexyl rings by hydrogenation using conditions known in the art such as those described by P. Rylander in "Catalytic Hydrogenation in Organic Syntheses", Academic Press, New York 1979, pages 195–199. Typical hydrogenation conditions employ alcohols, such as methanol, ethanol or isopropanol as solvents and palladium, rhodium or ruthenium catalysts. These processes are illustrated by the equations shown below:

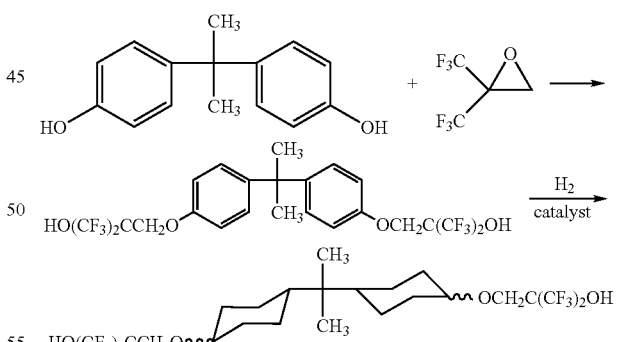

The fluorinated alcohol groups may then be protected as disclosed above.

A portion or substantially all of the alcohol groups in a poly-hydroxy compound may be converted to the corresponding fluorinated alkoxide groups and some or all of the fluorinated alkoxide groups may be converted to the protected fluorinated alcohol groups by suitable choice of reagent stoichiometries and reaction conditions. One skilled in the art may pick an appropriate degree of conversion of the alcohol groups to fluorinated alcohol groups and subsequently to protected fluorinated alcohol groups so as to optimize performance of the dissolution inhibitor.

A dissolution inhibiting amount of the dissolution inhibitor is combined with the binder, solvent and any photoresist additives. An example of a suitable solvent is 2-heptanone. The dissolution inhibitor may be present in the amount of about 0.5 to about 50 weight %, more typically about 1 to about 35 weight %, and most typically about 5 to about 20 weight %, based on the total weight of the photoresist composition (solids).

Other Components

The compositions of this invention can contain optional additional components. Examples of additional components which can be added include, but are not limited to, resolution enhancers, adhesion promoters, residue reducers, coating aids, plasticizers, and $T_g$ (glass transition temperature) modifiers. Crosslinking agents may also be present in negative-working resist compositions. Some typical crosslinking agents include bis-azides, such as, 4,4'-diazidodiphenyl sulfide and 3,3'-diazidodiphenyl sulfone. Typically, a negative working composition containing at least one crosslinking agent also contains suitable functionality (e.g., unsaturated C=C bonds) that can react with the reactive species (e.g., nitrenes) that are generated upon exposure to UV to produce crosslinked polymers that are not soluble, dispersed, or substantially swollen in developer solution.

Process for Forming a Photoresist Image

The process for forming a photoresist image on a substrate comprises, in order:

(A) imagewise exposing a photoresist layer to form imaged and non-imaged areas, wherein the photoresist layer is prepared from a photoresist composition comprising:
  (a) a binder;
  (b) a photoactive component; and
  (c) the at least one dissolution inhibitor comprising a paraffinic or cycloparaffinic compound as described herein; and (B) developing the exposed photoresist layer having imaged and non-imaged areas to form the relief image on the substrate.

The photoresist layer is prepared by applying a photoresist composition onto a substrate and drying to remove the solvent. The so formed photoresist layer is sensitive in the ultraviolet region of the electromagnetic spectrum and especially to those wavelengths $\leq 365$ nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine ($F_2$) laser with output at 157 nm. Since, as discussed supra, use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

The photoresist compositions of this invention must contain sufficient functionality for development following imagewise exposure to UV light. Preferably, the functionality is an acid or protected acid such that aqueous development is possible using a basic developer such as sodium hydroxide solution, potassium hydroxide solution, or ammonium hydroxide solution.

Some typical fluorine-containing polymers and dissolution inhibitors in the photoresist compositions of this invention are acid-containing materials comprised of at least one fluoroalcohol-containing monomer of structural unit:

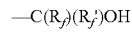

wherein $R_f$ and $R_f'$ are as described hereinabove. The level of acidic fluoroalcohol groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material or dissolution inhibitor should contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmosphers below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are typical and fluorinated solvents are more typical.

Substrate

The substrate employed in this invention can be any material used in semiconductor manufacture, for example, silicon, silicon oxide, silicon nitride and the like.

Other Applications

Such antireflective layers may be applied using many different techniques such as spin coating, chemical vapor deposition and aerosol deposition. The formulation of antireflective compositions is well known to those skilled in the art. The primary optical properties of the composition being used for the antireflective layer to be considered are the optical absorption and the index of refraction.

The oligomer disclosed herein as a dissolution inhibitor in a photoresist composition could be used in an antireflection layer for semiconductor lithography. In particular, since low optical absorption at 157 nm is a prime attribute of the materials disclosed herein, they should be of particular utility in an antireflective layer which is used for microlithography at this wavelength.

For this application, the invention provides an element comprising a support, and at least one antireflection layer; wherein the antireflection layer is prepared from a composition comprising at least one compound containing at least one functional group having the structure

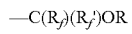

wherein $R_f$ and $R_f'$ are the same or different fluoroalkyl groups of from one to about ten carbon atoms or taken together are $(CF_2)_a$ wherein a is an integer ranging from 2 to about 10 and R is a hydrogen atom or an acid labile areas or it may be removed separately using any known development process such as that employing aqueous or solvent developers, or by dry etch processes as are also know in the art. The photoresist layer used together with an antireflective layer may be any photoresist layer known in the art, particularly, provided it has an absorption coefficient of less than about 4.0 µm$^{-1}$ at a wavelength of 157 nm. The antireflective layer may be present between the support and the photoresist layer or it may be present on the surface of the photoresist layer, on a side opposite that of the support.

EXAMPLES

Dissolution Inhibitor 1 ("DI1"). The Dissolution Inhibitor IPDC-F-OMOM was synthesized using the following procedure:

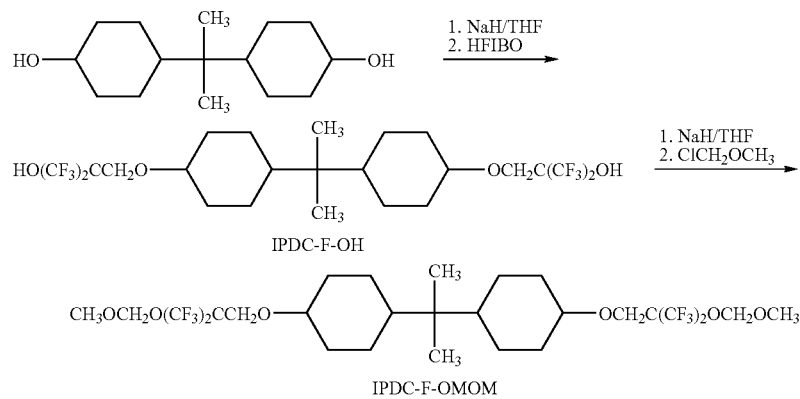

protecting group and, especially, wherein the compound has an absorption coefficient of less than about 4.0 µm$^{-1}$ at a wavelength of 157 nm.

The element may further comprise a photoresist layer.

The invention also provides a process for improved lithographic patterning of a photoresist element having a support, a photoresist layer and an antireflective layer comprising:

(A) imagewise exposing the photoresist element to form imaged and non-imaged areas, wherein the antireflective layer is prepared from a composition comprising at least one compound containing at least one functional group having the structure

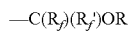

wherein $R_f$ and $R_f'$ are the same or different fluoroalkyl groups of from one to about ten carbon atoms or taken together are $(CF_2)_a$ wherein a is an integer ranging from 2 to about 10 and R is a hydrogen atom or an acid labile protecting group and, especially, wherein the compound has an absorption coefficient of less than about 4.0 µm$^{-1}$ at a wavelength of 157 nm; and (B) developing the exposed photoresist element having imaged and non-imaged areas to form the relief image on the substrate.

The antireflective layer may be removed during the development of the photoresist having imaged and non-imaged A mixture of 50.6 g (0.2 mol) of 4,4'-isopropylidenedicyclohexanol (Aldrich Chemical Company, 95%, mixture of isomers) and 900 mL tetrahydrofuran (THF) was added to a suspension of sodium hydride (12.6 g, 0.5 mol) in 500 mL THF at 30° C. under nitrogen. The resulting mixture was stirred overnight at 30° C. Hexafluoroisobutylene oxide (HFIBO, DuPont, 75.6 g, 0.42 mol) was added dropwise and the resulting mixture was stirred for 48 hr at 30° C. Methanol was added to quench remaining sodium hydride and the mixture was concentrated to a semi-solid on a rotary evaporator. Water (500 mL) was added and the solution was acidified to pH 2 using concentrated hydrochloric acid. This mixture was extracted with 3×300 mL of ethyl acetate. The combined ethyl acetate extracts were washed with brine, dried over anhydrous magnesium sulfate, filtered and concentrated on a rotary evaporator to 120 g of semi-solid. This material was triturated with 50 mL hexane and filtered. The solid was washed with cold hexane and dried to give 12.2 g of solid identified as IPDC—F—OH by nmR. $^1$H NMR (δ, CDCl$_3$) 0.65 (s, 6H), 0.93–1.10 (m, 4H), 1.15–1.60 (m, 6H), 1.75 (d, 4H), 2.10 (d, 4H), 3.20–3.40 (m, 2H), 3.75 (s, 4H), 4.10 (s, 2H); $^{19}$F NMR (δ, CDCl$_3$)–77.74. The filtrate from the trituration was concentrated on a rotary evaporator. The residue was dissolved in 400 mL of methylene chloride and extracted with 2×300 mL of 5% aqueous KOH. The combined aqueous solutions were acidified to pH 3 with 20% aqueous hydrochloric acid and extracted with 2×300 mL of methylene chloride. The combined extracts were washed with brine, dried over anhydrous magnesium sulfate to give 53 g of solid which was the desired product in less pure form by NMR analysis.

A solution of 12.0 g (0.02 mol) of IPDC—F—OH in 30 mL THF was added drop-wise to 1.21 g (0.048 mol) sodium hydride in 100 mL THF. Vigorous gas evolution occurred during the addition and a solid was formed. An additional 100 mL of THF were added to facilitate stirring. The mixture was stirred at room temperature for 2 hr. Chloromethyl methyl ether (3.38 g, 0.042 mol, Aldrich Chemical Company) was added drop-wise at room temperature and the mixture was stirred overnight. Water (50 mL) was added and this mixture was extracted with 3×200 mL ether. The combined water/ether extracts were washed with brine, dried over anhydrous magnesium sulfate and concentrated on a rotary evaporator to an oily solid. This material was dissolved in 300 mL hexane, washed with 4×100 mL 10% aqueous potassium hydroxide and brine, dried over anhydrous magnesium sulfate and concentrated on a rotary evaporator to 10.7 g of white solid. This material was chromatographed over silica gel using hexane/ethyl acetate (98/2) to elute to give 4.28 g of IPDC-F-OMOM. $^1$H NMR (δ, CDCl$_3$) 0.68 (s, 6H), 1.05 (m, 4H), 1.30 (m, 6H), 1.75 (d, 4H), 2.10 (d, 4H), 3.20 (m, 2H), 3.45 (s, 6H), 4.07 (s, 4H) 5.08 (s, 4H); $^{19}$F NMR (δ, CDCl$_3$) −74.56. Anal. Calcd. for $C_{27}H_{40}F_{12}O_6$: C, 47.10; H, 5.86; F, 33.11. Found: C, 47.69; H, 6.29; F, 26.10.

Dissolution inhibitor 2 ("DI2"). The dissolution inhibitor, Bis(methoxymethyl ether) of bis(fluoroalcohol) adduct (formed by reaction of HFIBO with 4,8 bis(hydroxymethyl)-tricyclo[5.2.1.0$^{2,6}$]decane) was prepared by a process similar to that described above by reaction of the HFIBO adduct with chloromethyl methyl ether in the presence of sodium hydride in THF. The dissolution inhibitor formed has the following structure:

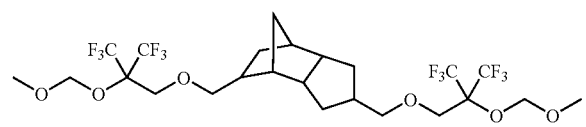

Binder 1 Preparation Procedure:

Synthesis of an NB-F-OMOM/NB-F—OH vinyl addition polymer. In a nitrogen-filled glovebox, 0.68 g (1.74 mmol) of the allyl palladium complex [(3-MeCHCHCH$_2$)PdCl]$_2$ and 1.20 g (3.47 mmol) silver hexafluoroantimonate were suspended in chlorobenzene (20 mL). The resulting mixture was stirred at room temperature for 30 minutes. The mixture was then filtered to remove precipitated AgCl. The resulting solution was added to a mixture of 11.9 g (35.6 mmol) NB-F-MOM, 40 g (137.8 mmol) NB-F—OH, and chlorobenzene (220 mL). The resulting reaction mixture was stirred for two days at room temperature. The crude product polymer was precipitated in hexane (600 mL) under air, filtered, and washed with hexane. It was then dried under vacuum, affording 50 g of NB-F OMOM/NB-F-OH copolymer. Palladium metal was removed as follows: The crude polymer, THF (333 mL), and poly(4-vinylpyridine) (30 g) were combined inside a stainless steel pressure vessel. The pressure vessel was purged with hydrogen gas, and then heated to 75° C. under 1000 psi hydrogen for 18 h and with agitation. After cooling, the reaction mixture was taken out of the pressure vessel and filtered through a 0.2 μm Nylon filter. The resulting solution was concentrated to dryness to afford 38.7 g of purified of NB-F-OMOM/NB-F—OH vinyl addition copolymer. $^{19}$F NMR (acetone-d$_6$β−75.05 [C(CF$_3$)$_2$ OCH$_2$OCH$_3$], −76.69 [C(CF$_3$)$_2$OH]. From integration of the $^{19}$F NMR absorptions, the polymer was determined to contain repeat units derived as follows: 86 mole % derived from NB-F—OH and 14 mole % derived from NB-F-OMOM. GPC: $M_n$=28,148; $M_w$=57,885; $M_w/M_n$=2.06. Using inductively coupled plasma, it was determined that the residual Pd level was <500 ppb. A 5 weight % solution in 2-heptanone was made for spin-coating, film sample(s) were spin coated, and the absorption coefficient at 157 nm was measured at two different film thicknesses: Results obtained were the following: 2.21 μm$^{-1}$ (966 Å film thickness) and 2.13 μm$^{-1}$ (852 Å film thickness).

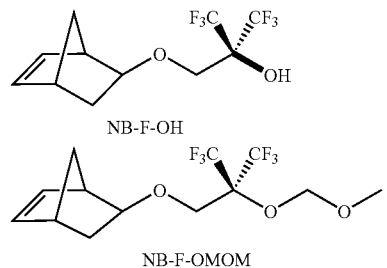

Binder 2 Preparation Procedure:

Synthesis of a TFE/NB-F—OH/NB-F-OMOM/tBA copolymer (molar ratio: 70/23/5/2 feed)

A 200 mL stainless steel pressure vessel was charged with 40.0 g (0.138 mol) of NB-F—OH (NB-OCH$_2$C(CF$_3$)$_2$OH wherein NB is the norborn-2-en-5-yl grouping), 10.0 g (0.03 mol) of NB-F-OMOM (NB-OCH$_2$C(CF$_3$)$_2$OCH$_2$OCH$_3$ wherein NB is the norborn-2-en-5-yl grouping), 1.54 g (0.12 mol) of tBA (tert-butyl acrylate, Aldrich Chemical Company), 75 mL of 1,1,2-trichlorotrifluoroethane and 0.6 g of Perkadox 16. The vessel was closed, cooled in dry ice, evacuated and purged with nitrogen. It was charged with 42 g (0.42 mol) of TFE (tetrafluoroethylene) and heated at 50° C. for 18 hr. The vessel was cooled to room temperature and vented to one atmosphere pressure. The vessel contents were removed as a clear solution using additional 1,1,2-trichlorotrifluoroethane to rinse. The 1,1,2-trichlorotrifluoroethane solution was added slowly to excess hexane to precipitate a white polymer that was filtered, washed with hexane and dried overnight in a vacuum oven. There was obtained 12.0 g (13% conversion) of the tetrapolymer. Anal. Found: C, 44.09; H, 4.09; F, 40.43.

Procedure 1 for Sample Preparation and Transparency Measurement:

Two film samples of different thicknesses were made of the specified polymers, their thicknesses determined, and their absorption coefficient values at 157 nm determined using the following general procedure:

Samples were first spin coated onto silicon wafers using a Brewer Cee (Rolla, Mo.), Spincoater/Hotplate model 100CB.

a) Two to four silicon wafers were spun at different speeds (e.g. 2000, 3000, 4000, 6000 rpm) to obtain differing film thickness and subsequently baked at 120° C. for 30 minutes. The dried films were then measured for thickness on a Gaertner Scientific (Chicago, Ill.), L116A Ellipsometer. (400 to 1200 angstrom range). Two spin speeds were then selected from this data to spin the CaF$_2$ substrates for the spectrometer measurement.

b) Two CaF$_2$ substrates (1" (2.54 cm) diameter×0.80" (2.03 cm) thickness) were selected and each was run as a reference transmission data file on a McPherson Spectrometer (Chemsford, Mass.), 234/302 monochrometer, using a 632 Deuterium Source, 658 photomutiplier, and Keithley 485 picoammeter.

c) Then two speeds were selected from the silicon wafer data (a) to spin the sample material onto the CaF$_2$ reference substrates (e.g. 2000 and 4000 rpm) to achieve the desired film thickness. Then each was baked at 120° C. for 30 minutes and the sample transmission data file of each was collected on the McPherson Spectrometer. Then the sample files were divided by the reference CaF$_2$ files.

d) The resulting absorbance files were then adjusted for film thickness to give absorbance per micron of film thickness (AC).

Example 1

The following solution was prepared and magnetically stirred overnight.

| Component | Wt. (gm) |
| --- | --- |
| Binder 1, NB-F-OMOM/NB-F-OH copolymer (molar ratio: 80/20 feed, analyzed 84/16 by $^{19}$F NMR) | 0.490 |
| 2-Heptanone | 4.121 |
| DI1, IPDC-F-OMOM | 0.090 |
| 6.82% (wt) solution of triphenylsulfonium nonaflate dissolved in 2-heptanone which had been filtered through a 0.45µ PTFE syringe filter. | 0.299 |

Spin coating was done using a Brewer Science Inc. Model-100CB combination spin coater/hotplate on a 4 in. diameter Type "P", <100> orientation, silicon wafer, development was performed on a Litho Tech Japan Co. Resist Development Analyzer (Model-790).

The wafer was prepared by depositing 6 mL of hexamethyidisilazane (HMDS) primer and spinning at 5000 rpm for 10 seconds. Then about 3 mL of the above solution, after filtering through a 0.45 µm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm$^2$. By using a mask with 18 positions of varying neutral optical density, a wide variety of exposure doses were generated. After exposure the exposed wafer was baked at 100° C. for 120 seconds.

The wafer was developed in aqueous tetramethylammonium hydroxide (TMAH) solution (OHKA NMD-3, 2.38% TMAH solution). This test generated a positive image with a clearing dose of 20.5 mJ/cm$^2$. When no IPDC-F-OMOM dissolution inhibitor was present, i.e., replaced by more copolymer, no image was obtained due to removal of the unimaged coating at the same development time.

Example 2

The following solution was prepared and magnetically stirred overnight.

| Component | Wt. (gm) |
| --- | --- |
| Binder 2 (TFE/NB-F-OH/NB-F-OMOM/tBA Copolymer (molar ratio: 70/23/5/2 feed) | 0.408 |
| 2-Heptanone | 4.268 |
| DI1, IPDC-F-OMOM | 0.075 |
| 6.82% (wt) solution of triphenylsulfonium nonaflate dissolved in 2-heptanone which had been filtered through a 0.45µ PTFE syringe filter. | 0.249 |

A wafer was prepared from the photoresist composition of this Example following the same procedure as described in Example 1. The wafer was developed following the same procedure as described in Example 1. This developed wafer generated a positive image with a clearing dose of 20.5 mJ/cm$^2$.

Example 3

The following solutions were prepared and magnetically stirred overnight.

| | Wt. (gm) | | |
| --- | --- | --- | --- |
| Component | A | B | C |
| Binder 1, NB-F-OMOM/NB-F-OH copolymer | 0.250 | 0.200 | 0.200 |
| 2-Heptanone | 4.750 | 4.750 | 4.750 |
| t-Butyl Lithocholate (TBLC) | | 0.050 | |
| DI1, IPDC-F-OMOM | | | 0.050 |

A wafer was prepared using the photoresist composition of this Example following the sample preparation and transparency measurement at 157 nm as described in the above Procedure 1 For Sample Preparation And Transparency Measurement.

The IPDC-F-OMOM dissolution inhibitor was found to be significantly more transparent than a carboxylate containing dissolution inhibitor (t-butyl lithocholate) as indicated by the following absorbance data:

| | Absorbance at 157 nm (A/µm) |
| --- | --- |
| (A) Binder 1 | 2.21 (996 Å) |
| | 2.13 (852 Å) |
| (B) Binder 1 with TBLC (20 wt. %) | 3.17 (898 Å) |
| | 2.99 (784 Å) |
| (C) Binder 1 with DI1, IPDC-F-OMOM (20 wt. %) | 2.25 (858 Å) |
| | 2.19 (755 Å) |

Example 4

The following solutions were prepared and magnetically stirred overnight.

| | Wt. (gm) | | |
|---|---|---|---|
| Component | A | B | C |
| Binder 2, TFE/NB-F-OH/NB-F-OMOM/ tBA copolymer | 0.820 | 0.160 | 0.160 |
| 2-Heptanone | 15.58 | 3.800 | 3.800 |
| t-Butyl Lithocholate (TBLC) | | 0.040 | |
| DI1, IPDC-F-OMOM | | | 0.040 |

A wafer was prepared using the photoresist composition of this Example following the sample preparation and transparency measurement at 157 nm as described in the above Procedure 1 For Sample Preparation And Transparency Measurement.

The IPDC-F-OMOM dissolution inhibitor was found to be significantly more transparent than a carboxylate containing dissolution inhibitor (t-butyl lithocholate) as indicated by the following absorbance data:

| | | Absorbance at 157 nm (A/μm) |
|---|---|---|
| (A) | Binder 2 | 1.50 (1043 Å) |
| | | 1.78 (902 Å) |
| (B) | Binder 2 TBLC (20 wt. %) | 1.96 (734 Å) |
| | | 2.29 (635 Å) |
| (C) | Binder 2 with, IPDC-F-OMOM (20 wt. %) | 1.84 (691 Å) |
| | | 1.77 (602 Å) |

Example 5

The following solution was prepared and magnetically stirred overnight.

| Component | Wt. (gm) |
|---|---|
| Binder 1 | 0.490 |
| 2-Heptanone | 4.121 |
| DI2, Bis(methoxymethyl ether) of bis(fluoroalcohol) adduct formed by reaction of HFIBO with 4,8-bis(hydroxymethyl)tricyclo[5.2.1.0$^{2,6}$]decane | 0.090 |
| 6.82% (wt) solution of triphenylsulfonium nonaflate dissolved in 2-heptanone which had been filtered through a 0.45μ, PTFE syringe filter. | 0.299 |

A wafer was prepared from the photoresist composition of this Example following the same procedure as described in Example 1. The wafer was developed following the same procedure as described in Example 1. The wafer generated a positive image with a clearing dose of less than or equal to 20.5 mJ/cm$^2$. When none of dissolution inhibitor was present, i.e., replaced by more copolymer, a positive image was obtained but "dark development" in the unexposed areas was much more substantial.

Example 6

The following solution was prepared and magnetically stirred overnight.

| Component | Wt. (gm) |
|---|---|
| Binder 2, TFE/NB-F-OH/NB-F-OMOM/tBA copolymer | 0.408 |
| 2-Heptanone | 4.268 |
| DI2, Bis(methoxymethyl ether) of bis(fluoroalcohol) adduct formed by reaction of HFIBO with 4,8-bis(hydroxymethyl)tricyclo[5.2.1.0$^{2,6}$]decane | 0.075 |
| 6.82% (wt) solution of triphenylsulfonium nonaflate dissolved in 2-heptanone which had been filtered through a 0.45μ PTFE syringe filter. | 0.249 |

A wafer was prepared from the photoresist composition of this Example following the same procedure as described in Example 1. The wafer was developed following the same procedure as described in Example 1. Develoment generated a positive image with a clearing dose of $\leq$20.5 mJ/cm$^2$. When none of dissolution inhibitor was present, i.e., replaced by more copolymer, "dark development" was severe with the coating being washed off in unexposed areas.

What is claimed is:

1. A photoresist composition comprising:
   (a) a polymeric binder;
   (b) a photoactive component; and
   (c) at least one dissolution inhibitor comprising a paraffinic or cycloparaffinic compound containing at least one functional group having the structure

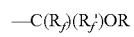
   —C(R$_f$)(R$_f^1$)OR wherein R$_f$ and R$_f^1$ are the same or different fluoroalkyl groups of from one to about ten carbon atoms or taken together are (CF$_2$)$_a$ wherein a is an integer ranging from 2 to about 10 and R is a hydrogen atom or an acid labile protecting group, and wherein the molecular weight (Mn) of the polymeric binder is greater than or equal to about two times the molecular weight of the dissolution inhibitor.

2. The photoresist composition of claim 1 in which the dissolution inhibitor has an absorption coefficient of less than about 4.0 μm$^{-1}$ at a wavelength of 157 nm.

3. The photoresist composition of claim 2 wherein the polymeric binder has an absorption coefficient of less than about 4.0 μm$^{-1}$ at a wavelength of 157 nm.

4. The photoresist composition of claim 1 wherein the dissolution inhibitor has an absorption coefficient of less than about 3.5 μm$^{-1}$ at a wavelength of 157 nm.

5. The photoresist composition of claim 1 wherein the dissolution inhibitor has an absorption coefficient of less than about 3.0 μm$^{-1}$ at a wavelength of 157 nm.

6. The photoresist composition of claim 1 wherein R$_f$ and R$_f^1$ are trifluoromethyl.

7. The photoresist composition of claim 1 wherein R is selected from the group consisting of carbonate substituents formed from a tertiary aliphatic alcohol, stabilized carbocation forming group, and acetal group.

8. The photoresist composition of claim 7 wherein the carbonate substituent formed from a tertiary aliphatic alcohol is selected from the group consisting of t-butyl carbonate, 2-methyl-2-adamantyl carbonate and isobornyl carbonate.

9. The photoresist composition of claim 7 wherein the stabilized carbocation forming group is selected from the group consisting of t-butyl, 2-methyl-2-adamantyl, cyclopropylcarbinyl, 2-propenyl, and 2-trimethylsilylethyl.

10. The photoresist composition of claim 7 wherein the acetal group is selected from the group consisting of 2-tetrahydropyranyl, 2-tetrahydrofuranyl, and alpha-alkoxyalkyl.

11. The photoresist composition of claim 10 wherein the acetal group is methoxymethyl or ethoxymethyl.

12. The photoresist composition of claim 1 wherein the dissolution inhibitor is a saturated oligomer having a molecular weight of less than or equal to about 3000.

13. The photoresist composition of claim 12 wherein the saturated oligomer is selected from the group consisting of:

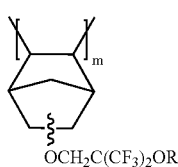 and 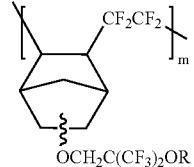

wherein m is an integer ranging from 2 to about 9 and R is an acid labile protecting group.

14. The photoresist composition of claim 13 wherein R is $CH_2OR^5$ and $R^5$ is an alkyl group of from 1 to about 10 carbon atoms.

15. The photoresist composition of claim 1 wherein the dissolution inhibitor has the structure:

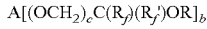

wherein A is a paraffinic or cycloparaffinic group containing 2 to about 30 carbon atoms, $R_f$ and $R_f'$ are the same or different fluoroalkyl groups of from one to about ten carbon atoms or taken together are $(CF_2)_a$ wherein a is an integer ranging from 2 to about 10, R is a hydrogen atom or an acid labile protecting group, b is an integer ranging from 1 to about 10 and c is an integer of 0 or 1.

16. The photoresist composition of claim 15 wherein the cycloparaffinic group is a steroidal nucleus.

17. The photoresist of claim 15 wherein b is an integer greater than 1.

18. The photoresist of claim 15 wherein b is an integer ranging from 2 to about 10.

19. The photoresist of claim 15 wherein A is derived from 4,4'-isopropylidene dicyclohexanol.

20. The photoresist of claim 19 wherein c is 1, $R_f$ and $R_f'$ are trifluoromethyl, R is a methoxymethyl group and b is 2.

21. The photoresist of claim 15 wherein the dissolution inhibitor is a cycloparaffinic compound.

22. The photoresist composition of claim 1 wherein the photoactive component is chemically bonded to the polymer of the binder.

23. The photoresist composition of claim 1 wherein the photoactive component is not chemically bonded to the polymer of the binder.

24. The photoresist of claim 1 wherein the dissolution inhibitor is a cycloparaffinic compound.

25. The photoresist of claim 1 wherein the dissolution inhibitor is a saturated reaction product of a compound having at least one phenolic group and 1,1-bis(trifluoromethyl)oxirane.

26. The photoresist of claim 25 wherein the reaction product is saturated by contact with hydrogen and a hydrogenation catalyst under hydrogenation conditions.

27. The photoresist of claim 25 in which the reaction product comprises a fluorinated alcohol group.

28. The photoresist of claim 27 wherein the fluorinated alcohol group is protected.

29. The photoresist of claim 1 further comprising a solvent.

30. The photoresist of claim 1, wherein the dissolution inhibitor is selected from a group consisting of

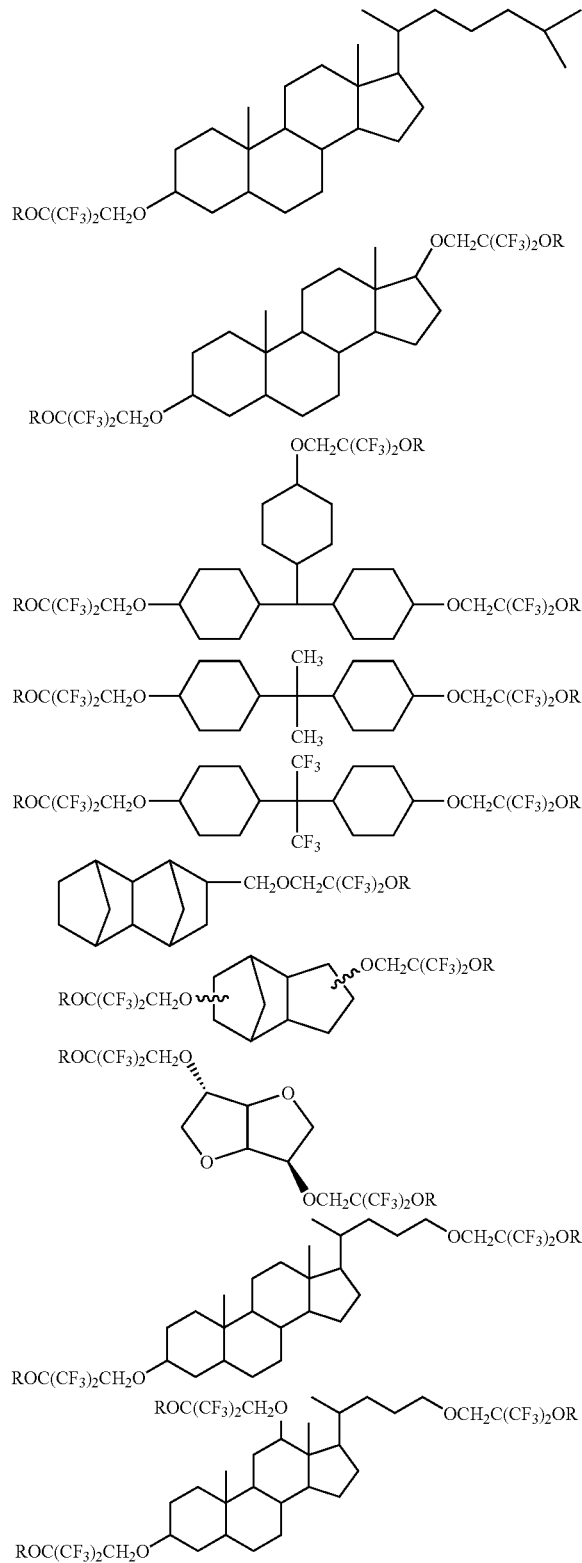

-continued

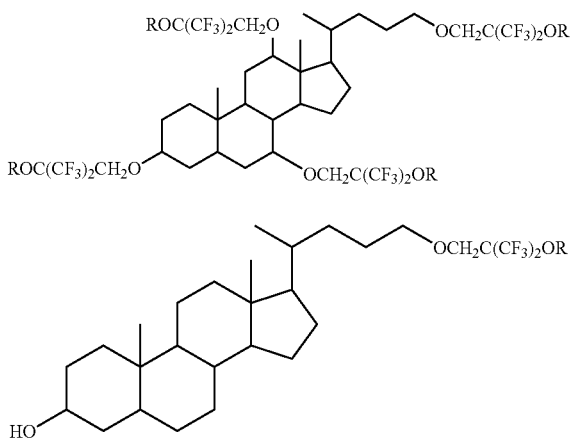

wherein R is a hydrogen atom or an acid labile protecting group.

31. A coated substrate comprising
a.) a substrate; and
b.) the photoresist of claim 1.

32. The coated substrate of claim 31, wherein the substrate is selected from the group consisting of silicon, silicon oxide, silicon oxynitride, and silicon nitride.

33. A process for forming a relief image on a substrate having a photoresist layer comprising, in order:
(A) imagewise exposing the photoresist layer to form imaged and non-imaged areas, wherein the photoresist layer is prepared from a photoresist composition comprising:
(a) a polymeric binder;
(b) at least one photoactive component; and
(c) at least one dissolution inhibitor comprising a paraffinic or cycloparaffinic compound containing at least one functional group having the structure —$C(R_f)(R_f')OR$ wherein $R_f$ and $R_f'$ are the same or different fluoroalkyl groups of from one to about ten carbon atoms or taken together are $(CF_2)_a$ wherein a is an integer ranging from 2 to about 10 and R is a hydrogen atom or an acid labile protecting group, and wherein the molecular weight (Mn) of the polymeric binder is greater than or equal to about two times the molecular weight of the dissolution inhibitor; and
(B) developing the imagewise exposed photoresist layer to form the relief image on the substrate.

34. The process of claim 33 wherein the dissolution inhibitor has an absorption coefficient of less than about 4 $\mu m^{-1}$ at a wavelength of 157 nm.

35. The process of claim 21 wherein the polymeric binder has an absorption coefficient of less than about 4.0 $\mu m^{-1}$ at a wavelength of 157 nm.

36. The process of claim 33 wherein the dissolution inhibitor is a paraffinic or cycloparaffinic oligomer having a molecular weight of less than or equal to 3000.

37. The process of claim 33 wherein the dissolution inhibitor is paraffinic or cycloparaffinic compound having the following structure:

$A[(OCH_2)_cC(R_f)(R_f')OR]_b$ wherein A is a paraffinic or cycloparaffinic group containing 2 to about 30 carbon atoms, $R_f$ and $R_f'$ are the same or different fluoroalkyl groups containing from one to about ten carbon atoms or taken together are $(CF_2)_a$ wherein a is an integer ranging from 2 to about 10, R is a hydrogen atom or an acid labile protecting group, b is an integer ranging from 1 to about 3, and c is an integer of 0 or 1.

38. The process of claim 37 wherein the cycloparaffinic group is a steroidal nucleus.

* * * * *